(12) United States Patent
Loo et al.

(10) Patent No.: US 6,228,673 B1
(45) Date of Patent: May 8, 2001

(54) METHOD OF FABRICATING A SURFACE COUPLED INGAAS PHOTODETECTOR

(75) Inventors: Robert Y. Loo, Agoura Hills; Adele E. Schmitz, Newbury Park; Julia J. Brown, Santa Monica, all of CA (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/311,673

(22) Filed: May 13, 1999

(51) Int. Cl.$^7$ .................................................. H01L 21/302
(52) U.S. Cl. ............................ 438/57; 438/605; 438/745
(58) Field of Search .................................. 438/98, 48, 57, 438/73, 77, 78, 91, 93, 94, 983, 604, 605, 745, 751, 930; 257/180, 458, 53, 438, 0

(56) References Cited

U.S. PATENT DOCUMENTS

| | | | |
|---|---|---|---|
| 4,441,187 | * | 4/1984 | Bouley et al. .......................... 372/46 |
| 4,996,163 | * | 2/1991 | Sasaki ..................................... 438/94 |
| 5,250,471 | * | 10/1993 | Kogure et al. . | |
| 5,266,518 | * | 11/1993 | Binsma et al. . | |
| 5,444,274 | * | 8/1995 | Sasaki .................................. 257/188 |
| 5,448,099 | * | 9/1995 | Yano .................................... 257/458 |
| 5,475,256 | * | 12/1995 | Sawada et al. ...................... 257/458 |
| 5,518,934 | * | 5/1996 | Forrest et al. ........................ 438/94 |
| 5,552,629 | * | 9/1996 | Watanbe et al. ..................... 257/438 |
| 5,646,069 | * | 7/1997 | Jelloian et al. ...................... 438/605 |
| 5,684,308 | * | 11/1997 | Lovejoy et al. ..................... 438/458 |
| 5,689,122 | * | 11/1997 | Chandrasekhar ................... 257/455 |
| 5,966,622 | * | 10/1999 | Levine et al. ....................... 438/459 |
| 6,005,266 | * | 12/1999 | Forrest et al. ....................... 257/458 |

* cited by examiner

Primary Examiner—Savitri Mulpuri
(74) Attorney, Agent, or Firm—T. Gudmestad

(57) ABSTRACT

A photodetector is fabricated in a multilayer structure having a semi-insulating InP substrate, an n+ InP contact layer overlying the InP substrate, an undoped InGaAs absorbing layer overlying the n+ InP contact layer, and a p+ doped InGaAs layer overlying the undoped InGaAs absorbing layer. A gold-beryllium p-contact dot is deposited onto the p+ doped InGaAs layer of the multilayer structure. A mesa structure is etched with a citric acid-based etchant into the multilayer structure. The mesa structure includes the metal p-contact dot, the p+ doped InGaAs layer, and the undoped InGaAs absorbing layer. The n+ InP contact layer is patterned, and a passive metallic n-contact layer is deposited onto the patterned n+ InP contact layer. A polyimide insulator layer overlying a portion of the structure is deposited and patterned, so that the polyimide insulator layer does not cover the passive metal p-contact dot and the metallic n-contact layer. The patterned organic polymer insulator layer is cured and the device is passivated by heating it in a nitrogen atmosphere. Thick metallic gold contract traces are deposited, with one trace extending to the gold-beryllium p-contact dot and the other trace extending to the metallic n-contact layer.

14 Claims, 5 Drawing Sheets

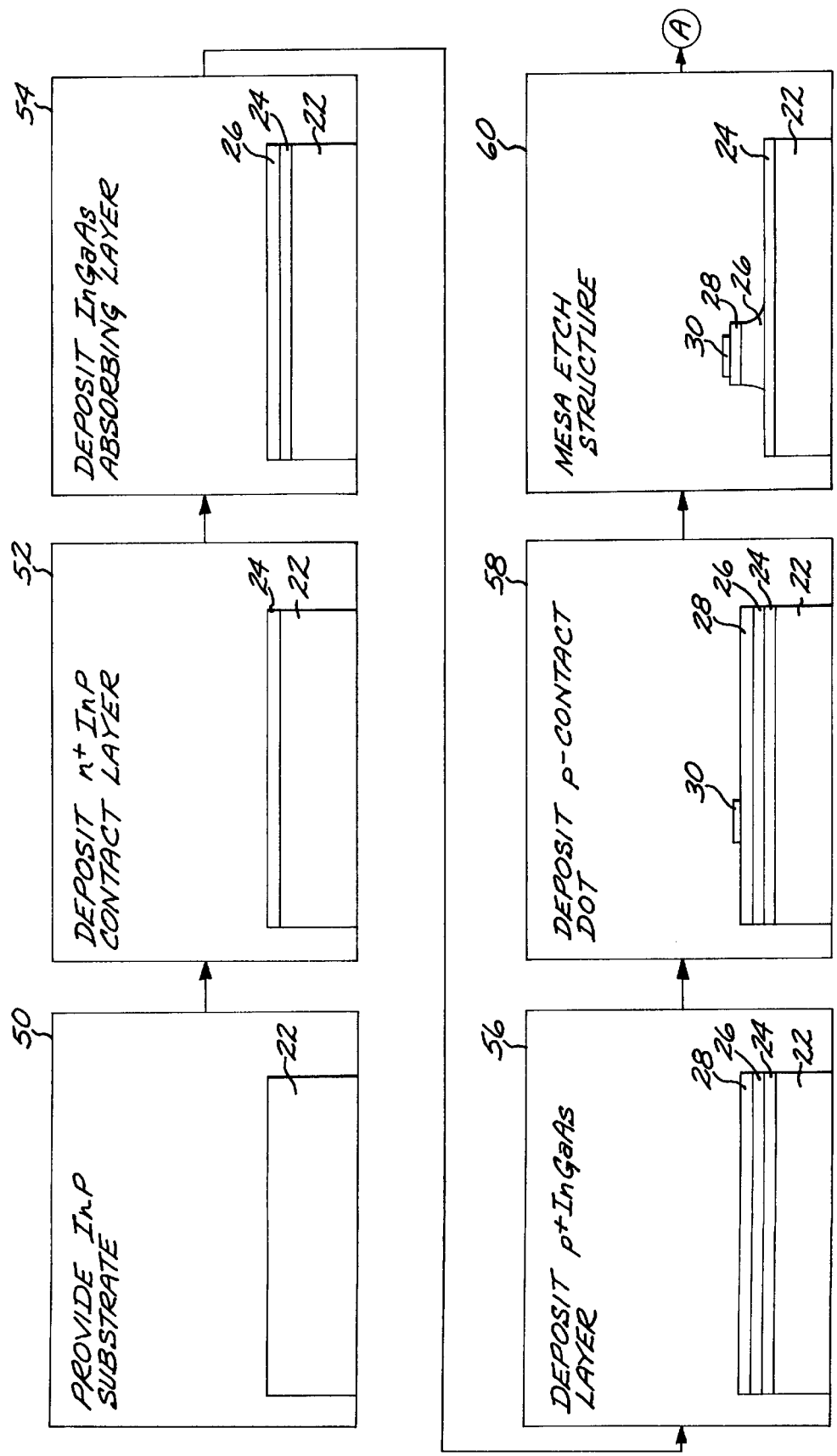
FIG. 2 (SHEET 1)

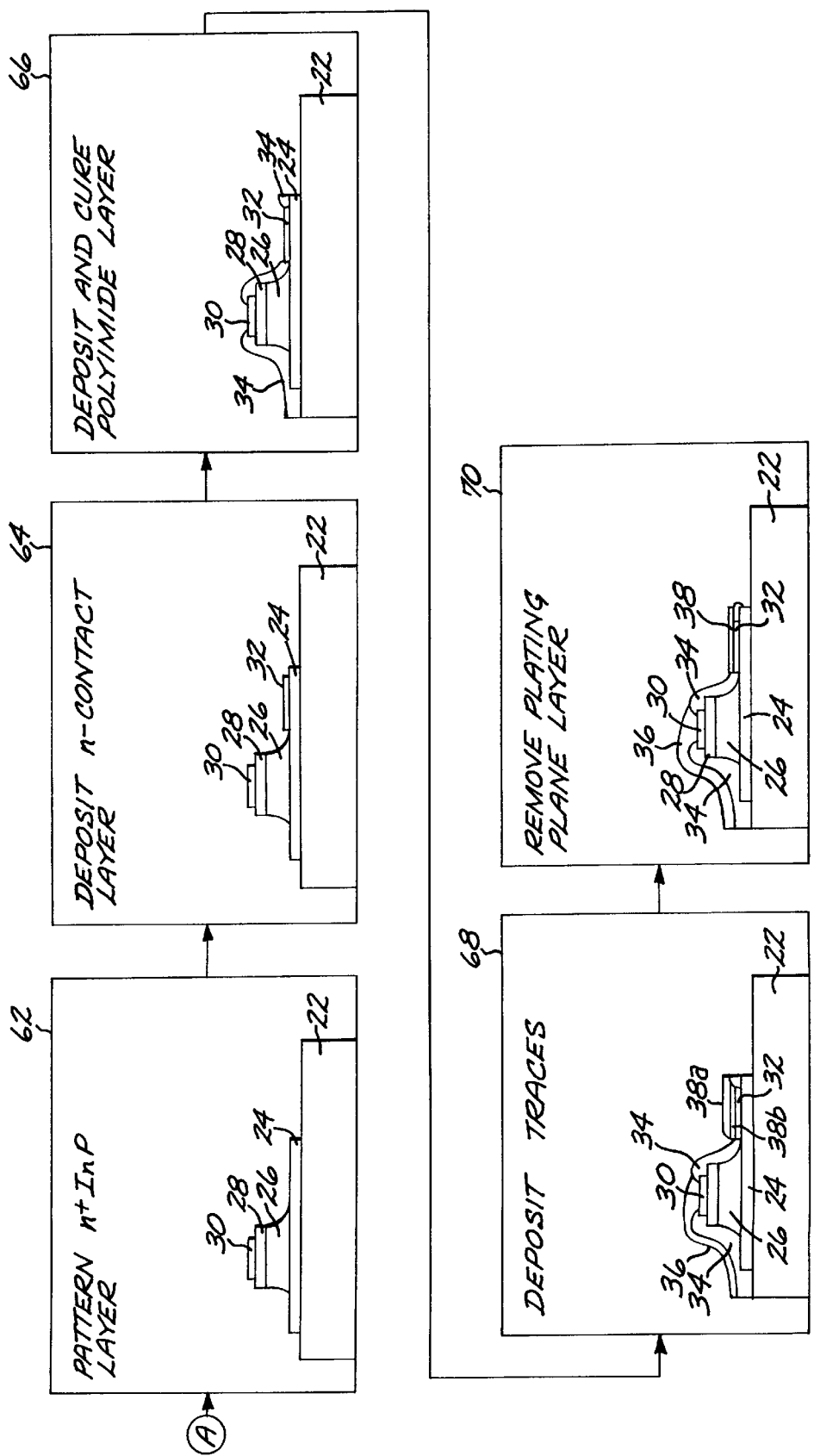
FIG. 2 (SHEET 2)

METHOD OF FABRICATING A SURFACE COUPLED INGAAS PHOTODETECTOR

BACKGROUND OF THE INVENTION

This invention relates to the fabrication of photodetectors, and, more particularly, to the fabrication of an InGaAs PIN photodetector having high optical-power handling capability with good linearity of conversion to an electrical signal.

A photodetector is a device that converts incident light into an electrical signal. A light beam is directed onto the photodetector, and the electrical output signal of the photodetector is a measure of the incident energy of the light beam. Photodetectors are available for both visible and infrared light energy.

Photodetectors are used in a wide variety of applications. For some, the photodetector need only detect the presence of light, and its other component capabilities are not important.

In other applications, however, the photodetector is used in a signal processing or handling system. The photodetector may act as a part of a signal handling system to convert incident light to an electrical signal for transmission or processing. The photodetector must therefore be capable of handling the desired input power of the light beam, and achieving the conversion to an electrical signal with good linearity, good frequency range, and low distortion.

A well known photodetector for the near infrared light range is the InGaAs PIN diode. In one version, this diode has a p+ doped InGaAs layer and an n+ InP layer, on either side of an undoped InGaAs layer, with this structure supported on a light-transparent InP substrate. Light incident on the front side of the substrate produces a voltage between the p+ doped InGaAs layer and the n+ InP layer, which voltage is generally proportional to the intensity of the incident light.

While operable, this InGaAs PIN diode has some shortcomings for particular applications, such as CATV analog transmission systems using RF and microwave antenna networks. For such systems to achieve their best performance, the maximum light intensity must be in the range of greater than 10 milliwatts (mW) of optical signal strength and the light-to-electrical signal conversion must have good linearity. Semiconductor lasers capable of producing an optical signal output in the range of a few tens of milliwatts are now available. However, most existing InGaAs PIN photodiodes are limited to about 2 mW of incident optical signal strength. The systems using the available InGaAs PIN photodiodes therefore cannot take advantage of the capabilities of the higher-power semiconductor lasers. Accordingly, the available photodetectors limit the performance of these systems.

There is a need for an improved photodetector which can handle high incident optical intensities and convert them to electrical signals with good linearity. The present invention fulfills this need, and further provides related advantages.

SUMMARY OF THE INVENTION

The present invention provides a fabrication technique for InGaAs PIN diodes. The diodes of the invention are operable to light intensities of greater than 15 mW, with good linearity of conversion to an electrical signal and low noise. The diode is operable over a broad frequency range extending into microwave frequencies. The InGaAs PIN diode of the invention utilizes a known basic structure, with the fabrication processing optimized for good performance.

In accordance with the invention, a method for fabricating a photodetector, utilizes a multilayer structure comprising a semi-insulating InP substrate, an n+ InP contact layer overlying the InP substrate, an undoped InGaAs absorbing layer overlying the n+ InP contact layer, and a p+ doped InGaAs layer overlying the undoped InGaAs absorbing layer. The method of the invention includes depositing a passive metal p-contact dot onto the p+ doped InGaAs layer of the multilayer structure, and etching a mesa structure into the multilayer structure. The mesa structure includes the passive metal p-contact dot, the p+ doped InGaAs layer, and the undoped InGaAs absorbing layer. The step of etching is performed with an etchant that does not attack the n+ InP contact layer and the InP substrate. The method further includes patterning the n+ InP contact layer, depositing a passive metallic n-contact layer onto the patterned n+ InP contact layer, and depositing a patterned organic polymer insulator layer overlying a portion of the structure. The patterned organic polymer insulator layer does not cover the passive metal p-contact dot and the metallic n-contact layer. The patterned organic polymer insulator layer is thereafter cured, and the device is passivated. Metallic contact traces are deposited, with a first trace extending to the passive metal p-contact dot and a second trace extending to the metallic n-contact layer.

The preferred multilayer structure includes the approximately 1 micrometer thick InP contact layer that is doped n+ with silicon or tin to a concentration of about $1 \times 10^{19}$ atoms per cubic centimeter. The absorbing layer is "undoped" InGaAs, where the term "undoped" indicates an absence of intentional doping and a background concentration of less than about $5 \times 10^{15}$ atoms per cubic centimeter. The doped InGaAs layer is doped p+ with beryllium or zinc to a concentration of about $1 \times 10^{19}$ atoms per cubic centimeter.

The passive metal p-contact dot is preferably gold-beryllium metal. The metallic n-contact layer is preferably formed of multiple sublayers, including a gold-germanium layer, a nickel layer, and a gold layer. The organic polymer insulator is preferably a polyimide, which is cured and passivated by heating in a nitrogen atmosphere. The metallic contact traces are preferably thick gold layers, most preferably from about 2.5 to about 3 micrometers in thickness.

The mesa structure is etched with an etchant that attacks the InGaAs layers, but not the InP layers. The preferred etchant is based on citric acid, most preferably an aqueous solution of citric acid, hydrogen peroxide, and phosphoric acid.

Prototypes of the InGaAs PIN photodiode of the invention have been measured to reproducibly produce a highly linear output over a range of light intensities from zero to over 15 mW, and in some cases to as high as 20 mW. The photodiode is operable over a wide bandwidth from dc to 20 GHz. Other performance features of the photodiode are also excellent.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 2 is a block flow diagram of the preferred method for fabricating the diode of FIG. 1;

DETAILED DESCRIPTION OF THE INVENTION

Figure 1:
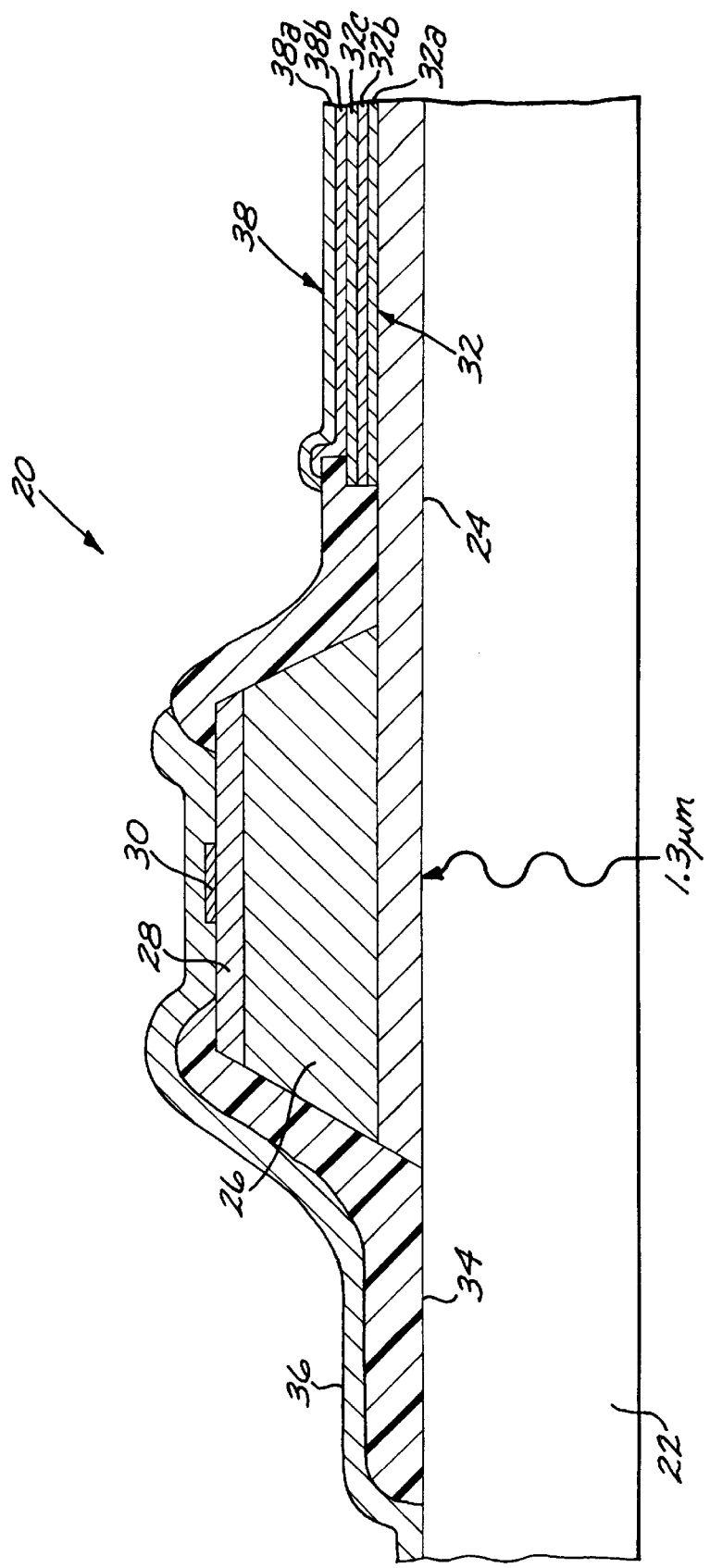
FIG. 1 is a schematic sectional view of an InGaAs PIN diode according to the invention.

FIG. 1 depicts a preferred form of an InGaAs PIN diode 20 fabricated according to the invention. The structure is not drawn to scale. The diode 20 includes a substrate 22 made of semi-insulating InP (indium phosphide). The substrate 22 may be of any operable thickness, but is typically about 600 micrometers thick for a 3 inch-diameter wafer. Overlying and contacting the substrate 22 is a doped InP contact layer 24. The contact layer 24 is preferably from about 0.5 to about 1.5 micrometers thick, most preferably about 1 micrometer thick. The contact layer is n+ doped with an element such as Si (silicon) or Sn (tin) in a concentration of from about $5 \times 10^{18}$ to about $\times 10^{19}$, preferably about $1 \times 10^{19}$, atoms per cubic centimeter.

Overlying and contacting the contact layer 24 is an absorbing layer 26 of InGaAs (indium gallium arsenide) that is not intentionally doped, termed "undoped" herein. Even though the absorbing layer 26 is not intentionally doped, there is typically a small background concentration of impurity atoms present, usually less than about $5 \times 10^{15}$ atoms per cubic centimeter. The absorbing layer 26 is preferably from about 0.5 to about 1.5 micrometers thick, most preferably about 1 micrometer thick.

Overlying and contacting the absorbing layer 26 is a doped InGaAs layer 28. The layer 28 is doped p+ with a dopant such as Be (beryllium) or Zn (zinc). The dopant is present in a concentration of from about $1 \times 10^{19}$ to about $3 \times 10^{19}$, preferably about $1 \times 10^{19}$, atoms per cubic centimeter. The layer 28 is preferably from about 0.2 to about 0.6 micrometers thick, most preferably about 0.5 micrometers thick. The layers 24, 26, and 28 together constitute a PIN structure.

A metallic p-contact of small lateral extent, termed a metallic p-contact dot 30, overlies and contacts the layer 28. The p-contact dot 30 is formed of a passive metal, preferably a Au—Be (gold-beryllium) alloy having a composition in weight percent of about 1.5 percent gold, 98.5 percent beryllium.

A metallic n-contact 32 overlies and contacts the contact layer 24, at a position laterally separated from the p-contact dot 30. The n-contact 32 is preferably in the form of a layer having a thickness of about 4000 Angstroms. The n-contact is made of a passive metal combination. A most preferred n-contact 32 includes a gold-germanium sublayer 32a (having a composition by weight of about 88 percent gold, about 12 percent germanium) overlying and contacting the layer 24, a nickel sublayer 32b overlying and contacting the layer 32a, and a gold sublayer 32c overlying and contacting the layer 32a.

A passive organic polymer insulator layer 34, preferably comprising a polyimide, overlies the structure just described, except for openings therethrough exposing the dot 30 and at least a portion of the n-contact 32.

A first metallic contact trace 36 extends to the p-contact dot 30, and a second metallic contact trace 38 extends to the n-contact layer 32. The traces 36 and 38 are preferably formed as a thick Au (gold) layer 38a from about 2.5 to about 3.0 micrometers thick overlying a thin Ti—Au (titanium-gold) plating plane layer 38b. These traces 36 and 38 are relatively thick at about 2.5–3.0 micrometers. This thickness of trace allows increased current flow and also aids in heat dissipation, both of which improve the ability of the diode to handle high optical intensities. For these reasons, even thicker traces 36 and 38 would be desirable.

When illuminated through the substrate 22 by light in the near infrared (e.g., about 1.3 micrometer wavelength), the PIN structure produces a potential difference and current that are transmitted through the traces 36 and 38 to external measurement apparatus, not shown.

FIG. 2 depicts a preferred approach for fabricating the diode 20 depicted in FIG. 1. Steps 50, 52, 54, and 56 set forth a method for preparing the multilayer structure of layers 22, 24, 26, and 28. The InP substrate 22 is provided, numeral 50. The n+ InP contact layer 24 is deposited overlying and in contact with the substrate 22, numeral 52. The InGaAs absorbing layer 26 is deposited overlying and in contact with the contact layer 24, numeral 54. The p+ InGaAs layer 28 is deposited overlying and in contact with the absorbing layer 26, numeral 56. The InP substrate 22 is available commercially. Each of the layers has the thickness, composition, dopants, and other features discussed above in relation to FIG. 1. Each of the depositing steps 52, 54, and 56 may be performed by any operable deposition technique, preferably molecular beam epitaxy (MBE) or metal oxide vapor phase epitaxy (MOVPE). Such deposition techniques are well known in the art for other applications.

The diode 20 is fabricated from this basic multilayer structure, as depicted in steps 58–70. To fabricate the diode, the p-contact dot 30 is deposited, numeral 58. The deposition is accomplished by patterning the upper side of the layer 28 using conventional photolithography techniques, and depositing the metal that forms the dot 30 through openings in the pattern. Photolithography is preferably used for this and succeeding steps of patterning, depositing, and etching, because in a typical case there will be many diodes 20 fabricated on the same InP substrate 22. The dots 30 are preferably formed of Au—Be alloy, deposited by thermal evaporation. Each dot 30 is typically about 28 micrometers in diameter and 1000 Angstroms thick.

The resulting structure is mesa etched, numeral 60. In mesa etching, the exposed upper surface of the structure is patterned using conventional photolithography techniques, leaving a protective layer overlying the dot 30 and surrounding area in a total diameter of about 30 micrometers. The remaining unprotected portions of the layers 28 and 26, both InGaAs, are etched away. The etchant is preferably a citric acid-based etchant, most preferably a solution of water, 1 molar citric acid, 30 percent aqueous solution of hydrogen peroxide, and 85 percent aqueous solution of phosphoric acid in a volume ratio of 220:55:5:1. This etchant is selective, in that it removes only the exposed InGaAs, and stops when it encounters the InP layer 24.

The n+ InP layer 24 is patterned to isolate the mesas of adjacent diodes 20 and to define an area for electrode attachment to layer 24 using conventional photolithography techniques, numeral 62. The etching is preferably accomplished using a solution of water, 48 percent aqueous solution of hydrogen bromide and 30 percent aqueous solution of hydrogen peroxide in a volume ratio of 100:250:2.

The n-contact layer 32 is deposited onto the patterned n+ InP layer 24, numeral 64, using conventional photolithography techniques. The n-contact layer is preferably deposited as three overlying sublayers. The Au—Ge sublayer 32a is deposited overlying and in contact with the layer 24, to a thickness of 900 Angstroms. The Ni sublayer 32b is deposited overlying and in contact with the layer 32a, to a thickness of 100 Angstroms. The gold sublayer 32c is deposited overlying and in contact with the layer 32b, to a thickness of 3000 Angstroms.

The polymeric insulating layer 34 is deposited overlying portions of the exposed surface and thereafter cured and passivated, numeral 66. The deposition is accomplished using conventional photolithography techniques. For this purpose, the polymer is preferably a photosensitive polyimide such as Probimide 7505 available from Olin Microelectronic Materials. The polymer is deposited overlying all areas of the exposed surface, except for the p-contact dot 30 and the n-contact layer 32, leaving at least some of these regions exposed. The polymer is deposited by spin coating and standard photolithographic definition. After deposition, the polymer must be cured by heating. To simultaneously cure the polymer and passivate the device, it is heated to an appropriate curing temperature in a pure nitrogen atmosphere. For the preferred polyimide, the curing is accomplished at a temperature of 350° F. and for a time of 1 hour.

The metallic contact traces 36 and 38 are deposited so as to reach to the respective p-contact dot 30 and the n-contact layer 32, numeral 68. Because the traces are relatively thick, they are preferably deposited by electroplating. To permit electroplating over the insulating polymer layer 34, a titanium-gold plating plane layer 38b is first deposited by a technique such as sputtering, to a thickness of about 200 Angstroms of titanium and 1000 Angstroms of gold, over the entire exposed surface of the structure. The upper surface is then patterned using conventional photolithography techniques with openings defining the traces 36 and 38. Using the plating plane layer 38b as the electrical contact, the remaining thicknesses of the traces 36 and 38 are deposited by electroplating a gold layer 38a to a thickness of from about 2.5 to about 3.0 micrometers through the openings of the photoresist.

Lastly, any exposed portion of the titanium-gold plating plane layer 38b is removed, numeral 70, preferably by ion milling. The upper surface of the layer 34 is thereby exposed, so that the exposed surface is insulating except for the traces 36 and 38.

The result is the diode 20 illustrated in FIG. 1.

Figure 3:
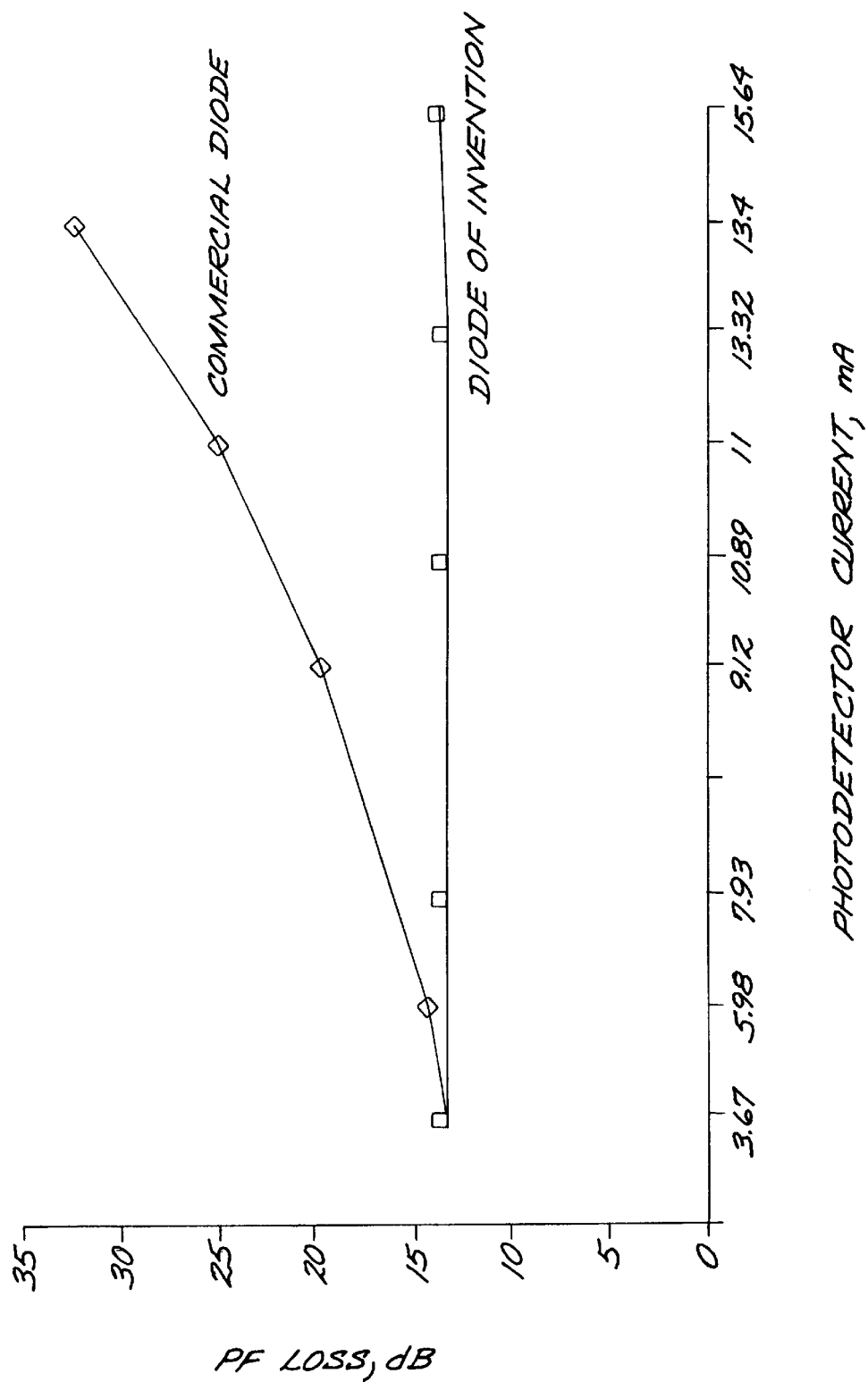
FIG. 3 is a graph of measured photodetector RF point-to-point link loss.
Figure 4:
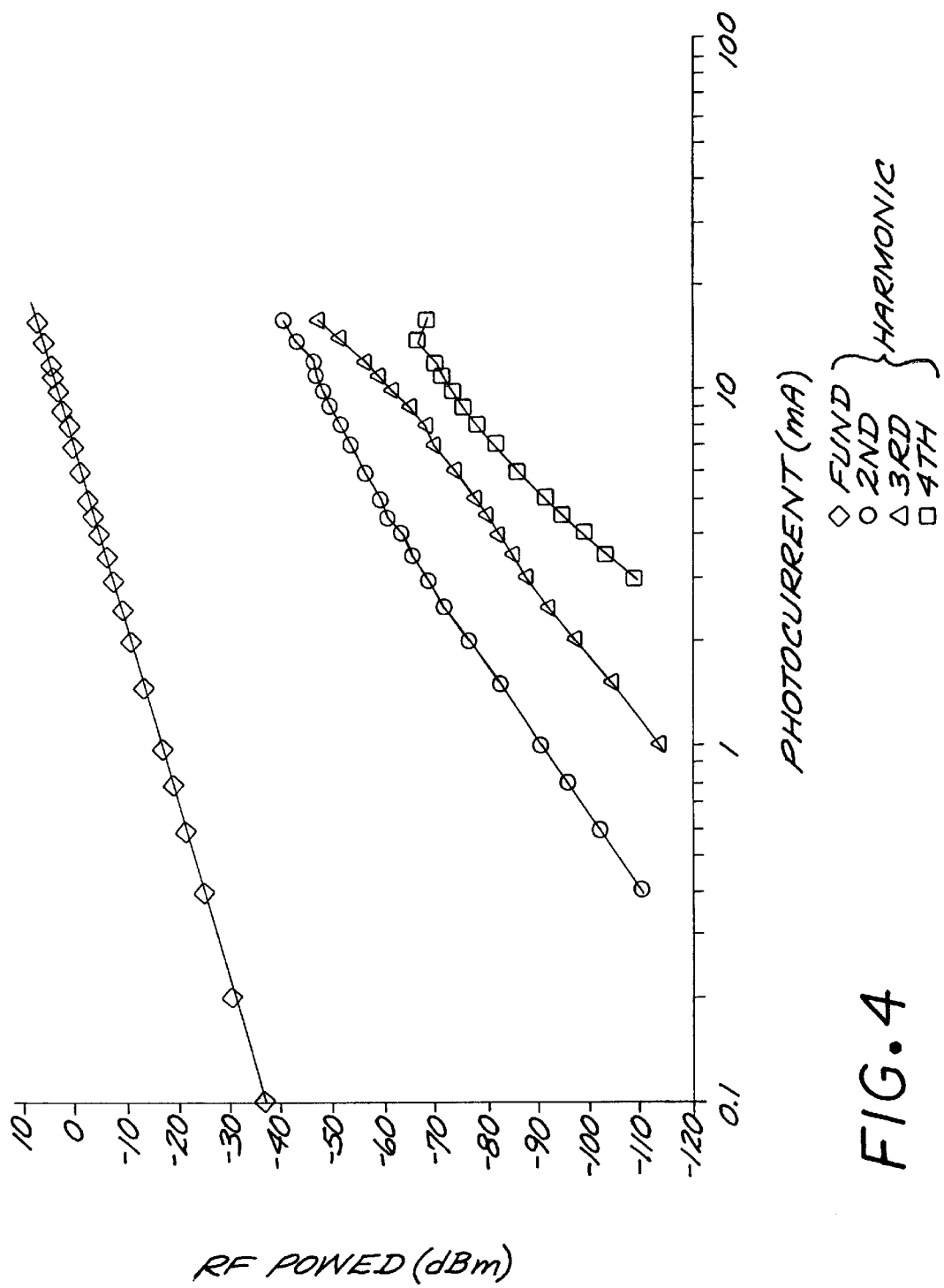
FIG. 4 is a graph of RF power as a function of photocurrent.

Diodes prepared according to the present approach have been fabricated and tested. FIG. 3 illustrates the measured RF point-to-point link loss for the diode of the invention as compared with a conventional commercial InGaAs PIN diode. The link loss of the diode 20 of the invention is approximately constant as a function of current output (and thence light input) of the diode, a desirably feature, while the link loss for a commercial diode increases substantially with increasing current. FIG. 4 illustrates that the output power as a function of photocurrent is nearly linear for each of the fundamental and the first three harmonics. All of the measurements are highly linear in form, and all of the harmonics are less than 60 dB at 5 mA of photocurrent over the frequency band of 15 GHz. The third intercept of the photodetector was measured to be 22 dBm. Additionally, the dc current voltage characteristics and the capacitance of the photodetector measured at −5V are less than 10 nanoamperes with a breakdown voltage of less than 20 volts, and 100 fF, respectively. The dc responsivity of the photodetector is 0.8 A/W.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for fabricating a photodetector, comprising the steps of furnishing a multilayer structure comprising
a semi-insulating InP substrate,
an n+ InP contact layer overlying and contacting the InP substrate,
an undoped InGaAs absorbing layer overlying and contacting the n+ InP contact layer, and
a p+ doped InGaAs layer overlying and contacting the undoped InGaAs absorbing layer;

depositing a passive metal p-contact dot onto the p+ doped InGaAs layer of the multilayer structure;

etching a mesa structure into the multilayer structure using an aqueous solution comprising citric acid, the mesa structure including the passive metal p-contact dot, the p+ doped InGaAs layer, and the undoped InGaAs absorbing layer, the step of etching including the step of utilizing an etchant that does not attack the n+ InP contact layer and the InP substrate;

patterning the n+ InP contact layer;

depositing a passive metallic n-contact layer onto the patterned n+ InP contact layer;

depositing a patterned organic polymer insulator layer overlying a portion of the structure, the patterned organic polymer insulator layer not covering the passive metal p-contact dot and the passive metallic n-contact;

curing the patterned organic polymer insulator layer; and depositing metallic contact traces to the passive metal p-contact dot and the passive n-contact layer.

2. The method of claim 1, wherein the step of furnishing includes the step of furnishing the multilayer structure wherein
the n+ InP contact layer is doped with a concentration of about $1 \times 10^{19}$ atoms per cubic centimeter of a dopant selected from the group consisting of Si and Sn.

3. The method of claim 1, wherein the step of furnishing includes the step of furnishing the multilayer structure wherein
the p+ doped InGaAs layer is doped with a concentration of about $1 \times 10^{19}$ atoms per cubic centimeter of a dopant selected from the group consisting of beryllium and zinc.

4. The method of claim 1, wherein the step of depositing the passive metal dot includes the step of
depositing a gold-beryllium metal dot.

5. The method of claim 1, wherein the step of etching a mesa structure includes the step of
etching using an aqueous solution of citric acid, hydrogen peroxide, and phosphoric acid.

6. The method of claim 1, wherein the step of patterning the n+ InP contact layer includes the step of
etching the n+ InP contact layer with an aqueous solution of hydrogen bromide and hydrogen peroxide.

7. The method of claim 1, wherein the step of depositing a passive metallic n-contact layer includes the step of depositing the contact with a gold-germanium sublayer overlying and contacting the patterned N+ InP contact layer, a nickel sublayer overlying and contacting the gold-germanium layer, and a gold sublayer overlying and contacting the nickel sublayer.

8. The method of claim 1, wherein the step of depositing a patterned organic polymer insulator layer includes the step of depositing a polyimide.

9. The method of claim 1, wherein the step of curing includes the step of heating the polymer insulator layer in a nitrogen atmosphere.

10. The method of claim 1, wherein the step of depositing metallic contact traces includes the step of depositing a titanium-gold sublayer, and thereafter depositing a gold layer having a thickness of from about 2.5 to about 3 micrometers.

11. A method for fabricating a photodetector, comprising the steps of furnishing a multilayer structure comprising
a semi-insulating InP substrate,
an n+ InP contact layer overlying and contacting the InP substrate,
an undoped InGaAs absorbing layer overlying and contacting the n+ InP contact layer, and
a p+ doped InGaAs layer overlying and contacting the undoped InGaAs absorbing layer;

depositing a gold-beryllium p-contact dot onto the p+ doped InGaAs layer of the multilayer structure;

etching a mesa structure into the multilayer structure using an aqueous solution comprising citric acid, the mesa structure including the gold-beryllium p-contact dot, the p+ doped InGaAs layer, and the undoped InGaAs absorbing layer, the step of etching including the step of utilizing an etchant that does not attack the n+ InP contact layer and the InP substrate;

patterning the n+ InP contact layer;

depositing a passive metallic n-contact layer onto the patterned n+ InP contact layer;

depositing a patterned organic polymer insulator layer overlying a portion of the structure, the patterned organic polymer insulator layer not covering the passive metal dot and the metallic n-contact layer;

curing the patterned organic polymer insulator layer by heating in a nitrogen atmosphere; and depositing metallic contact traces to the p-contact dot and the n-contact layer, the step of depositing including the step of depositing a gold layer having a thickness of from about 2.5 to about 3 micrometers.

12. The method of claim 11, wherein the step of etching a mesa structure includes the step of etching using an aqueous solution of citric acid, hydrogen peroxide, and phosphoric acid.

13. The method of claim 11, wherein the step of depositing a patterned organic polymer insulator layer includes the step of depositing a polyimide.

14. The method of claim 11, wherein the step of depositing metallic contact traces includes the step of depositing a titanium-gold sublayer, and thereafter depositing the gold layer overlying the titanium-gold sublayer.

* * * * *